United States Patent
Feng (10) Patent No.: US 10,186,747 B2
(45) Date of Patent: Jan. 22, 2019

(54) TRANSFORMER BASED ON-PACKAGE POWER COMBINER

(71) Applicant: Intel Corporation, Santa Clara, CA (US)

(72) Inventor: Lei Feng, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 15/283,353

(22) Filed: Oct. 1, 2016

(65) Prior Publication Data

US 2018/0097270 A1    Apr. 5, 2018

(51) Int. Cl.
| | |
|---|---|
| *H01P 5/12* | (2006.01) |
| *H03F 3/21* | (2006.01) |
| *H03F 3/24* | (2006.01) |
| *H01F 27/28* | (2006.01) |
| *H01F 41/04* | (2006.01) |
| *H01P 11/00* | (2006.01) |
| *H03F 3/195* | (2006.01) |

(52) U.S. Cl.
CPC ............ *H01P 5/12* (2013.01); *H01F 27/2804* (2013.01); *H01F 41/041* (2013.01); *H03F 3/195* (2013.01); *H03F 3/211* (2013.01); *H03F 3/245* (2013.01); *H01F 2027/2809* (2013.01); *H01P 11/007* (2013.01); *H03F 2200/451* (2013.01); *H03F 2200/537* (2013.01); *H03F 2200/541* (2013.01)

(58) Field of Classification Search
CPC ...... H01P 5/12; H01F 27/2804; H01F 41/041; H01F 2027/2809; H03F 3/195; H03F 3/245; H03F 2200/451; H01Q 1/50

USPC .................................................. 333/124–129
See application file for complete search history.

(56) References Cited

U.S. PATENT DOCUMENTS

| | | | |
|---|---|---|---|
| 7,675,365 B2* | 3/2010 | Lee ........................ | H03F 1/3211 330/195 |
| 2009/0175378 A1* | 7/2009 | Staszewski ............. | H01P 3/026 375/295 |
| 2009/0231076 A1 | 9/2009 | Jie | |
| 2011/0316624 A1 | 12/2011 | Kimball | |
| 2012/0249262 A1 | 10/2012 | Kim et al. | |
| 2015/0028986 A1 | 1/2015 | Barry et al. | |

FOREIGN PATENT DOCUMENTS

KR    10-2013-0033159    4/2013

OTHER PUBLICATIONS

International Search Report and Written Opinion for PCT/US2017/049223, dated Dec. 28, 2017, 12 pages.

* cited by examiner

*Primary Examiner* — Robert J Pascal
*Assistant Examiner* — Kimberly E Glenn
(74) *Attorney, Agent, or Firm* — Schwabe, Williamson & Wyatt, P.C.

(57) ABSTRACT

Embodiments are generally directed to a transformer based on-package power combiner. An embodiment of a power combiner includes multiple primary coils on a first metal layer of a package; a secondary coil on a second metal layer of the package, the secondary coil including multiple secondary coil portions, wherein each primary coil is located to be aligned with a respective one of the secondary coil portions; a trace on a third metal layer of the package; and multiple vias to connect the secondary coil portions to the trace on the third metal layer.

19 Claims, 10 Drawing Sheets

TRANSFORMER BASED ON-PACKAGE POWER COMBINER

TECHNICAL FIELD

Embodiments described herein generally relate to the field of electronic devices and, more particularly, a transformer based on-package power combiner.

BACKGROUND

As with other electronics, as the demand for smaller, more versatile, and more powerful electronic devices has grown, CMOS (Complementary Metal-Oxide Semiconductor) devices have been reduced in size, and are being operated at increased speeds.

As CMOS fabrication technology advances, the lowered power supply voltage puts a severe limitation on power amplifier design in a radio transmitter because the maximum output power is primarily determined by supply voltage and load impedance. As CMOS technology scales, it becomes more and more difficult to deliver enough power from a single power amplifier due to the reduced power supply voltage.

Thus, the traditional single output power amplifier (PA) faces increasing challenges to deliver the required power.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to a transformer based on-package power combiner.

In some embodiments, an apparatus, system, or process provides for a transformer based on-package power combiner. In some embodiments, a transformer based power combiner on package substrate to combine multiple power sources, for example power amplifiers, together in order to improve the total output power of the chip.

In operation, power combiner loss is critical to the overall transmitter efficiency. However, the CMOS technology generally does not include elements such as a high resistance substrate and multiple thick low loss resistance metal layers that may be utilized to reduce losses.

However, silicon packages may include low loss dielectric and multiple thick metals. As package technology supports finer pitch metal, an on package low loss power combiner can be achieved even with a large impedance transfer ratio. In some embodiments, a combination of advanced CMOS silicon and efficient package metal stack are applied to provide an efficient radio transmit system.

In some embodiments, an on package transformer based power combiner includes a set of transformer coils on a package substrate with multiple primary coils and shared secondary coils. Each primary coil is connected to a power amplifier on silicon. The secondary coil is connected to an off-chip antenna through package balls. Is such an implementation, each power amplifier delivers power into its corresponding primary coil. The secondary coil takes power from all primary coils through electromagnetic coupling and combines the power from each primary coil together to generate higher power.

Compared to a discrete power combiner on a printed circuit board (PCB) an embodiment of an on-package power combiner enables smaller size and offers great design flexibility. Compared to an on-chip power combiner, the package transformer based power combiner enables reduced loss due to the low loss material of package dielectric and multiple thick metal layers.

Figure 1:
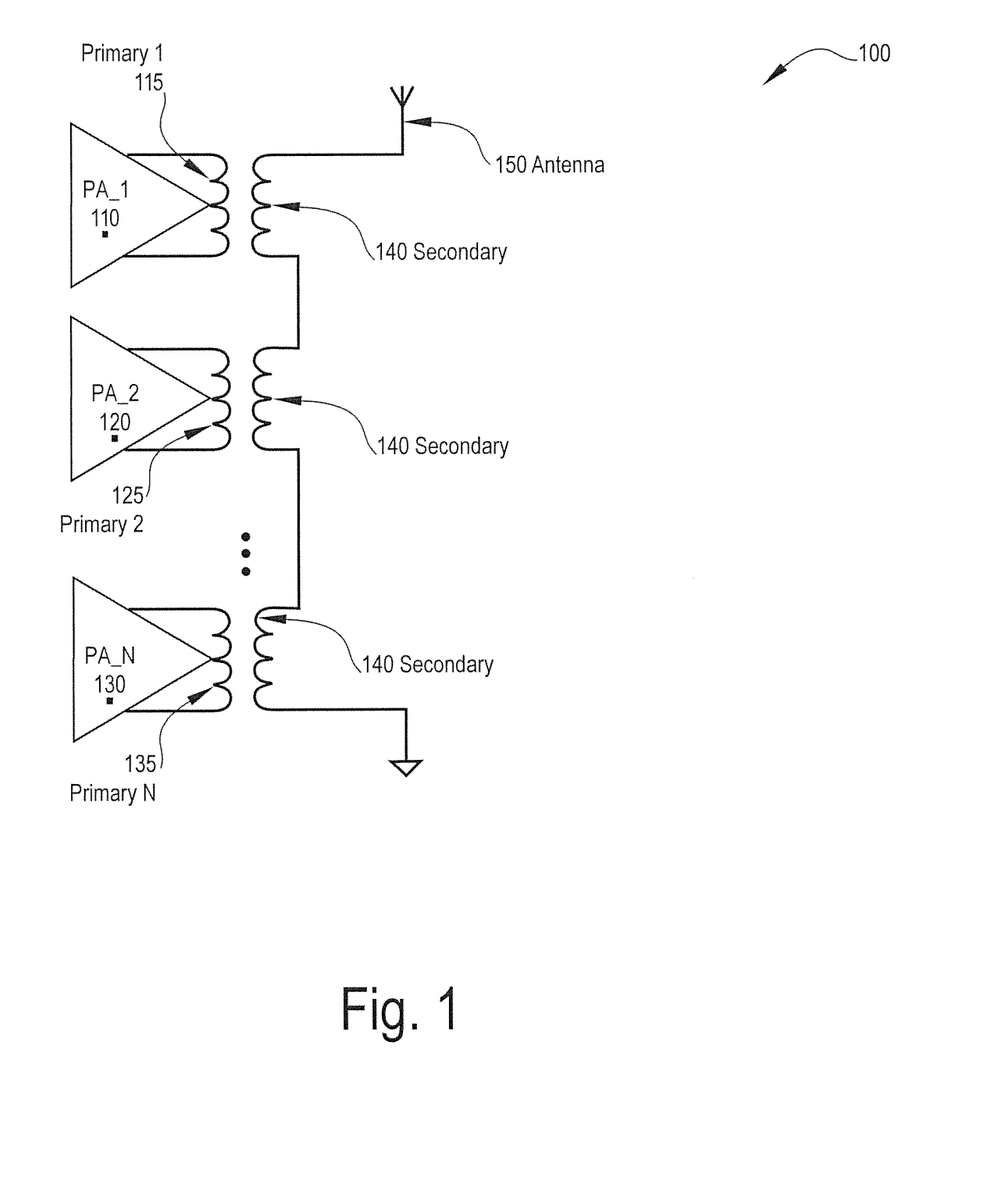
FIG. 1 is an illustration of a transformer based on-package power combiner.

FIG. 1 is an illustration of a transformer based on-package power combiner. As illustrated in FIG. 1, an on-package power combiner (OPPC) 100 includes multiple primary coils, such as the illustrated Primary 1 (115), Primary 2 (125), and continuing through Primary N (135), wherein each primary coil is connected with a respective power amplifier, shown as PA_1 (110), PA-2 (120), and continuing through PA-N (130). The power combiner 100 further includes a single secondary coil 140 to be coupled with primary coils, the secondary 140 to combine the power driving into each of the primary coils 115, 125, and 135.

In some embodiments, a combination of multiple PA units, such as illustrated in FIG. 1, may be utilized to generate a combined output power, such as to meet the output power target of modern wireless systems. In such a transformer based power combiner, multiple transformers are connected together with a serial connected secondary coil. The primary coils remain separated, with each providing power to the single secondary 140. In some embodiments, each primary coil is connected to a separate PA unit. In an N-way power combiner with N PA units, as illustrated in FIG. 1, the power delivered to an output antenna 150, the output antenna generally being a separate off-package antenna. In some embodiments, a first terminal of the secondary coil 140 is connected to the antenna 150 and a second terminal of the secondary coil is connected to a ground. Assuming an equal power being driven into each primary coil by each PA, the power output being is N times power out of one PA unit, minus any losses in circuit.

Figure 2A:
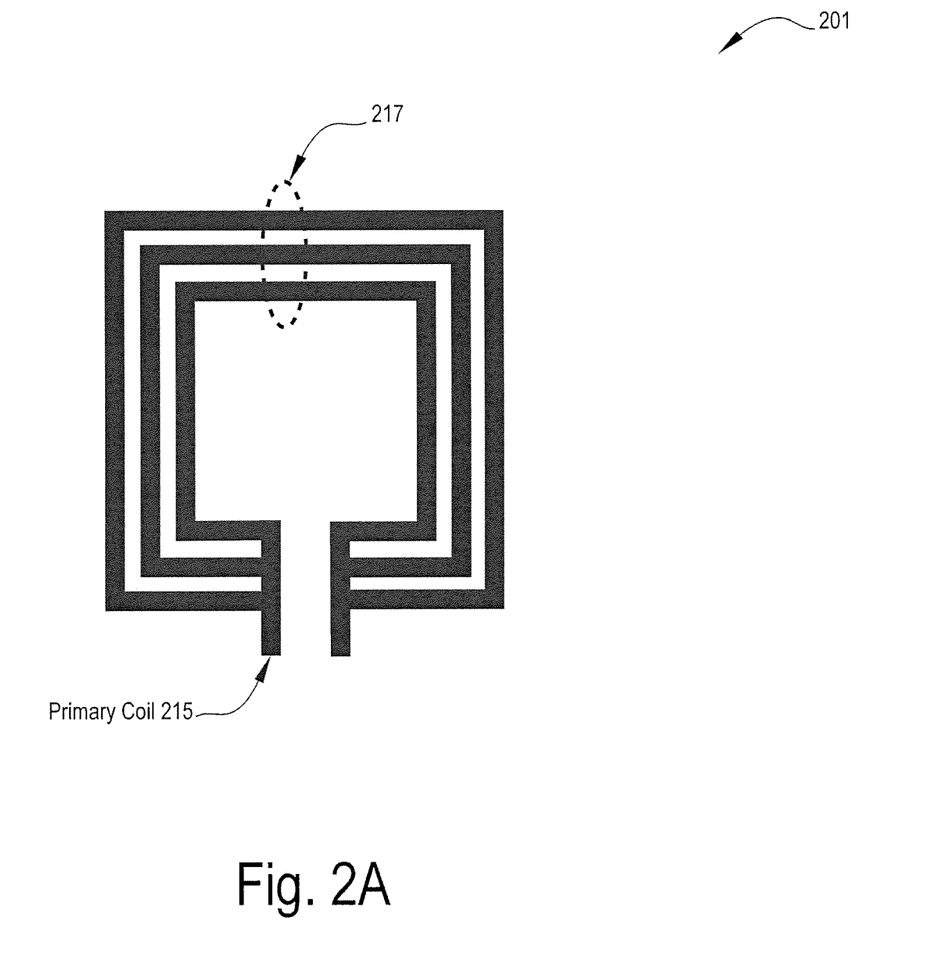
FIGS. 2A to 2C illustrate a transformer based on-package power combiner according to an embodiment.
Figure 2B:
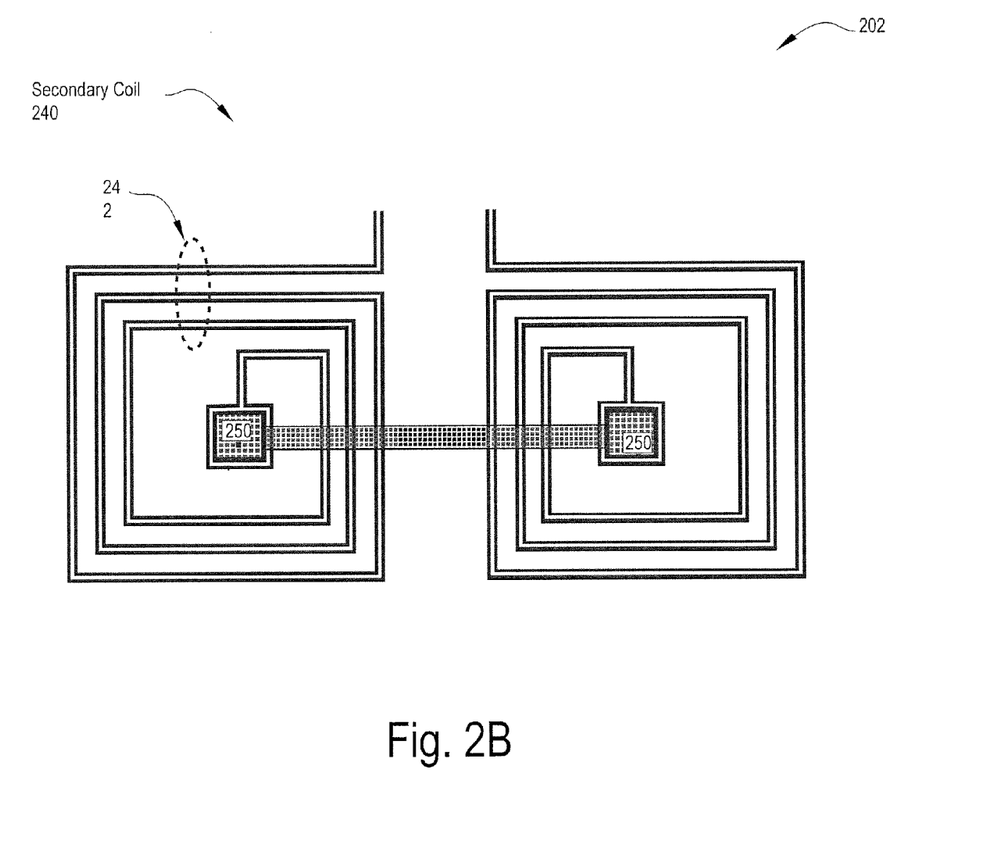
Figure 2C:
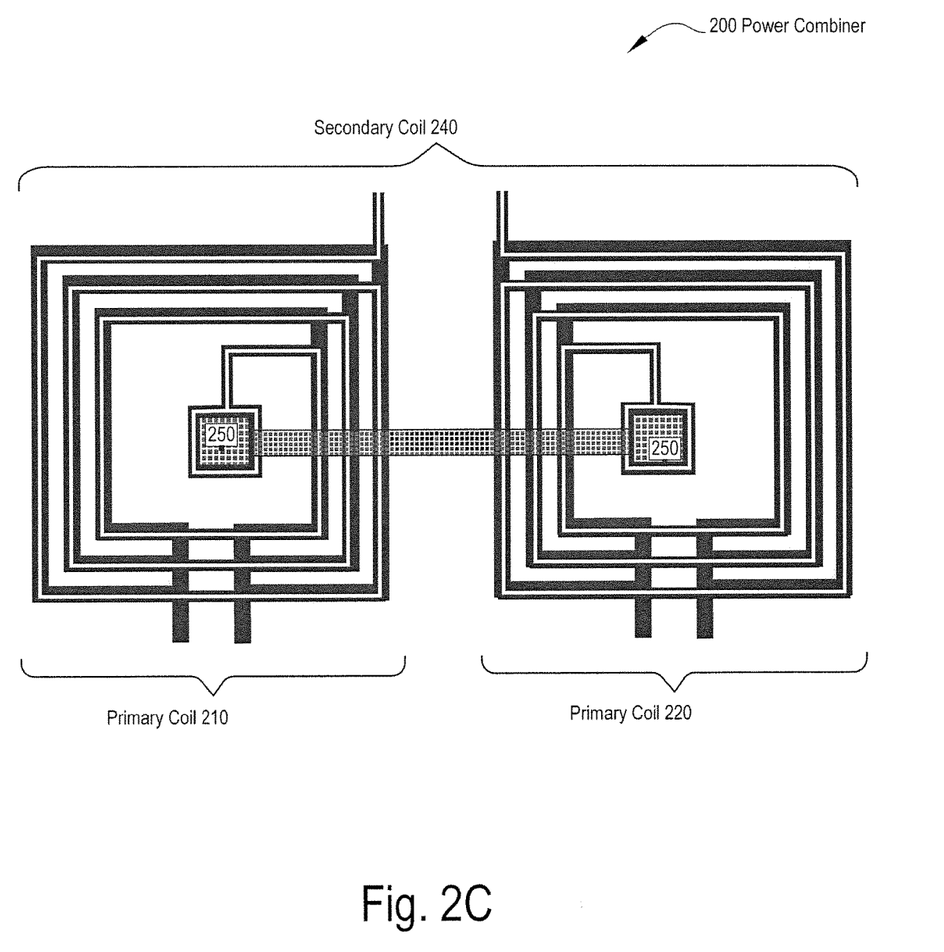

FIGS. 2A to 2C illustrate a transformer based on-package power combiner according to an embodiment. In some embodiments, a transformer based power combiner 200 is implemented on a package substrate. To illustrate this concept, a 3 turn coil based 2-way combiner is shown in FIGS. 2A to 2C.

As shown in FIG. 2A, a primary coil is composed of 3 parallel connected traces 217 on the same metal layer (M1). This implementation reduces primary inductance and improves the coupling between primary and secondary.

In FIG. 2B, the secondary coil includes two 3 turn coils 242 (wherein each may be referred to as a secondary coil portion) on the second metal layer (M2). The two secondary coil portions are connected together with a trace on the third metal layer (M3) through two vias drilled in the package, which are shown as the rectangular areas 250 in the middle of the coils.

FIG. 2C illustrates the full combiner with each primary coil 210 and 220 setting on top of half of the secondary coil 240, i.e. a first primary coil is above a first secondary coil portion and a second primary coil is above a second secondary coil portion.

Figure 3A:
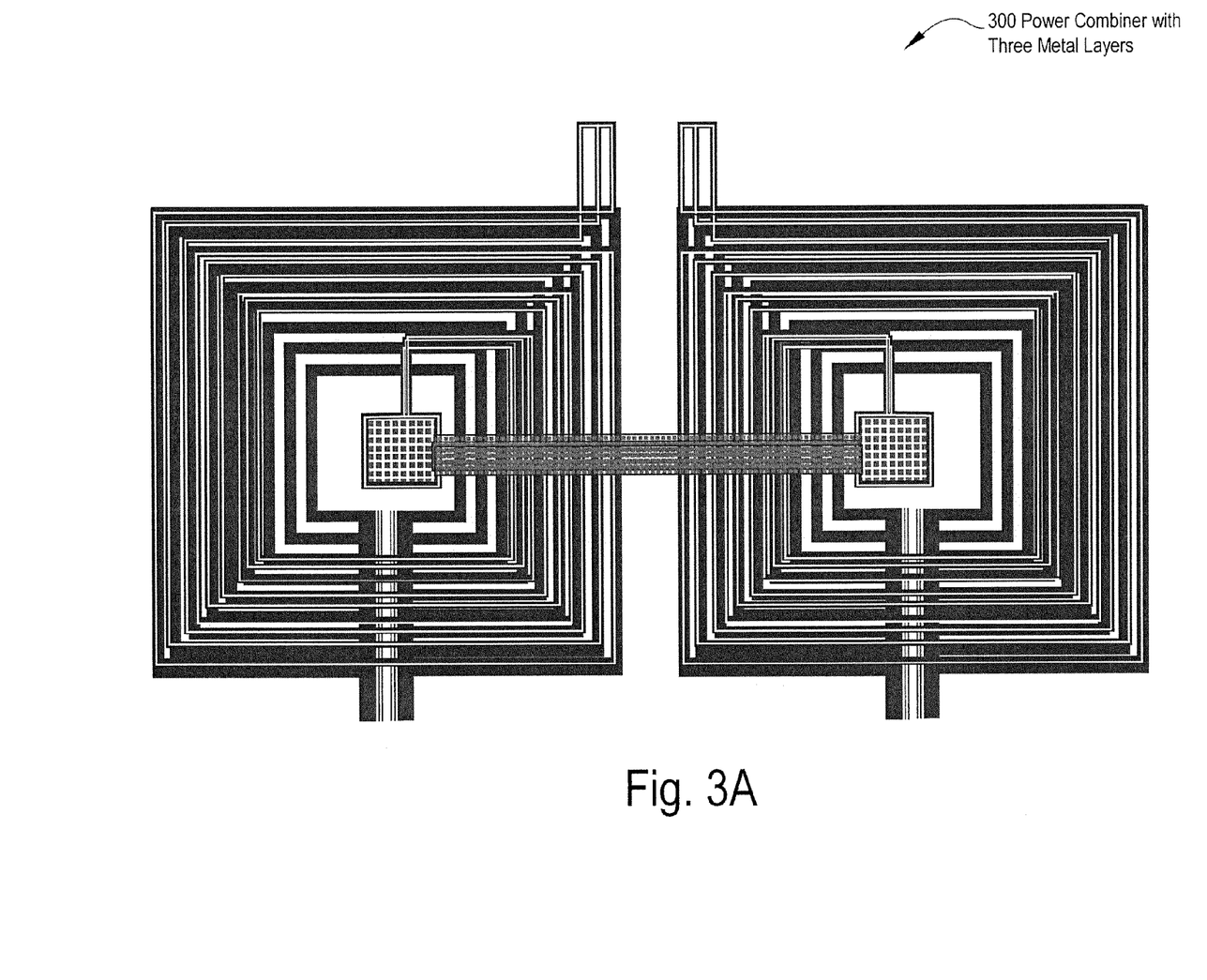
FIGS. 3A to 3C illustrate an implementation of an on-package transformer based power combiner.
Figure 3B:
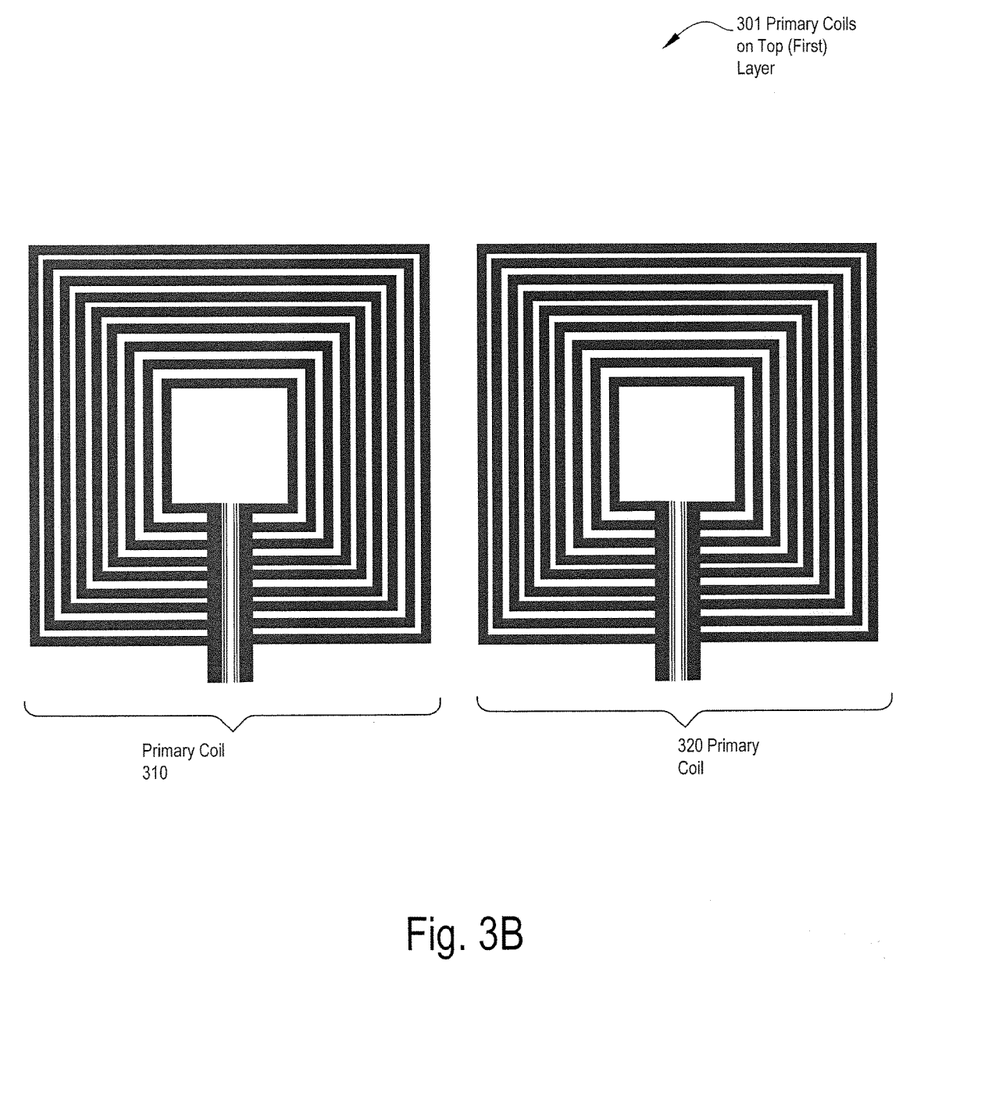
Figure 3C:
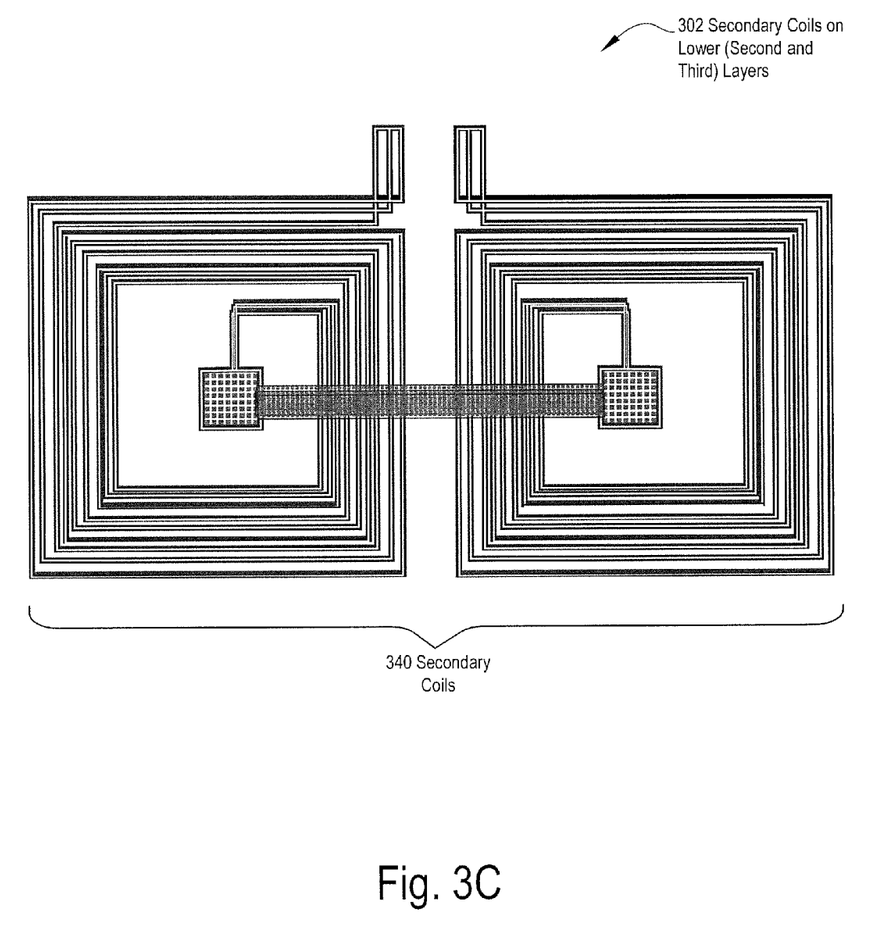

FIGS. 3A to 3C illustrate an implementation of an on-package transformer based power combiner.

As illustrated in FIG. 3A, an on-package power combiner 300 is provided on three metal layers. The power combiner in this example is a two-way combiner with two primary coils. FIG. 3B illustrates the two primary coils 310 and 320, which are constructed on first layer, the layer being a top layer in the illustrated embodiment. FIG. 3C then illustrates the secondary coil 340, the secondary coil being on the second and third layers of the package.

In some embodiments, the on-package power combiner 300 includes the following features:

(1) Limited use of vias—In some embodiments, the power combiner utilizes vias only to connect the secondary on the layers of the package. Because package vias are generally much bigger than trace width, it is difficult to achieve desired coupling between the primaries and the secondary when there are an excessive number of vias.

(2) Separation of primaries and secondary on different metal layers—In some embodiments, the primary coils and the secondary coil are separated on different metal layers. The separation of the primary and secondary coils is utilize to take advantage of the multiple thick metal layers (low loss) available in a package design. Further, package dielectrics are generally low loss. With the evolution of package technology moving towards even finer metal pitch, the implementation of the primary and second coils provides an efficient power combiner design.

To evaluate power combiner performance, simulations of three two-way combiner implementations (two primary coils) on a 6 layer package substrate (with metal width of 18 μm and metal space of 12 μm) are summarized in Table 1. Table 1 summarizes the resulting values at 2.5 GHz. In this table, the combiners are described by "PxSy" on the 1st row, where x and y are the number of turns in respectively in the primary and secondary coils, wherein primary turns are parallel connected and secondary turns are serial connected, as illustrated in FIG. 2C. In this illustration, the secondary coil for each combiner is connected to a 50 Ohm load, with the primary impedance being modified according to the applicable turn ratios.

TABLE 1

On-Package Power Combiner (OPPC) Performance

|  | P2S1 | P2S2 | P3S3 |
|---|---|---|---|
| Primary Inductance (nH) | 1.16 | 0.83 | 0.61 |
| Secondary Inductance (nH) | 3.40 | 7.91 | 12.7 |
| Self-Resonant Frequency (GHz) | >10 | >10 | 9.4 |
| Primary Impedance (Ohms) | 25 | 5 | 2.5 |
| Power Gain (dB) | −1.0 | −1.0 | −1.2 |

As seen in table 1, the simulated power combiner is capable of combining the power outputs on the prior coils without excessive power losses, the losses being in the range of −1.0 to −1.2 dB.

To further demonstrate operational advantages of an on-package power combiner, simulations of certain on-chip power combiners, for a high-resistance substrate and a low resistance substrate, are summarized in Table 2. In the simulations provided in Table 2, the silicon chip has two thick metal layers, one copper layer (3.5 μm thick) and one aluminum layer (2.8 μm thick), which are typical values in advanced CMOS SoC process. Further, the minimum metal spacing is 3 μm.

TABLE 2

On-Chip Power Combiner (OCPC) Performance

|  | High-Resistance Substrate | | | Low-Resistance Substrate | | |
|---|---|---|---|---|---|---|
|  | P2S1 | P2S2 | P3S3 | P2S1 | P2S2 | P3S3 |
| Primary Inductance (nH) | 0.65 | 0.65 | 0.445 | 0.58 | 0.58 | 0.41 |
| Secondary Inductance (nH) | 1.56 | 4.23 | 6.63 | 1.45 | 3.97 | 6.79 |
| Self-Resonant Frequency (GHz) | >10 | 8.9 | 7.1 | >10 | 6.8 | 4.6 |
| Primary Impedance (Ohms) | 40 | 15 | 5 | 40 | 15 | 5 |
| Power Gain (dB) | −1.3 | −1.2 | −1.3 | −4.1 | −2.5 | −2.2 |

In comparing Table 1 and Table 2, it can be seen that:

(1) While the power loss of OCPC (on-chip power combiner) on a high-resistance substrate is not greatly more to those of OPPC's (on-package power combiner) (increase of 0.2 to 0.3 dB in power loss), the power loss on a low-resistance substrate is significantly higher (increase of 1 to 3 dB in power loss).

(2) The self-resonant frequencies of OCPC are significantly lower than those of OPPC at higher turn ratios. This result thus enables a larger inductance and higher turn ratio in the on package power combiner in comparison with the on chip power combiner.

(3) It is more difficult to obtain a large impedance transfer ratio on OCPC in comparison with the OPPC as shown by the comparison of the inductance ratio (primary to secondary) of between the OPPC and the OCPC simulations.

Thus, advantages of the on-package power combiner over the on-chip power combiner include lower power loss, higher self resonant frequency, larger inductance ratio, and larger current capacity. Such advantages imply that the on-package power combiner implementation is advantageous for power amplifier design on advanced CMOS process nodes, especially for low-resistance substrate process. However, embodiments are not limited to this implementation, and the on-package power combiner may be implemented in any system requiring power output from multiple sources.

Figure 4:
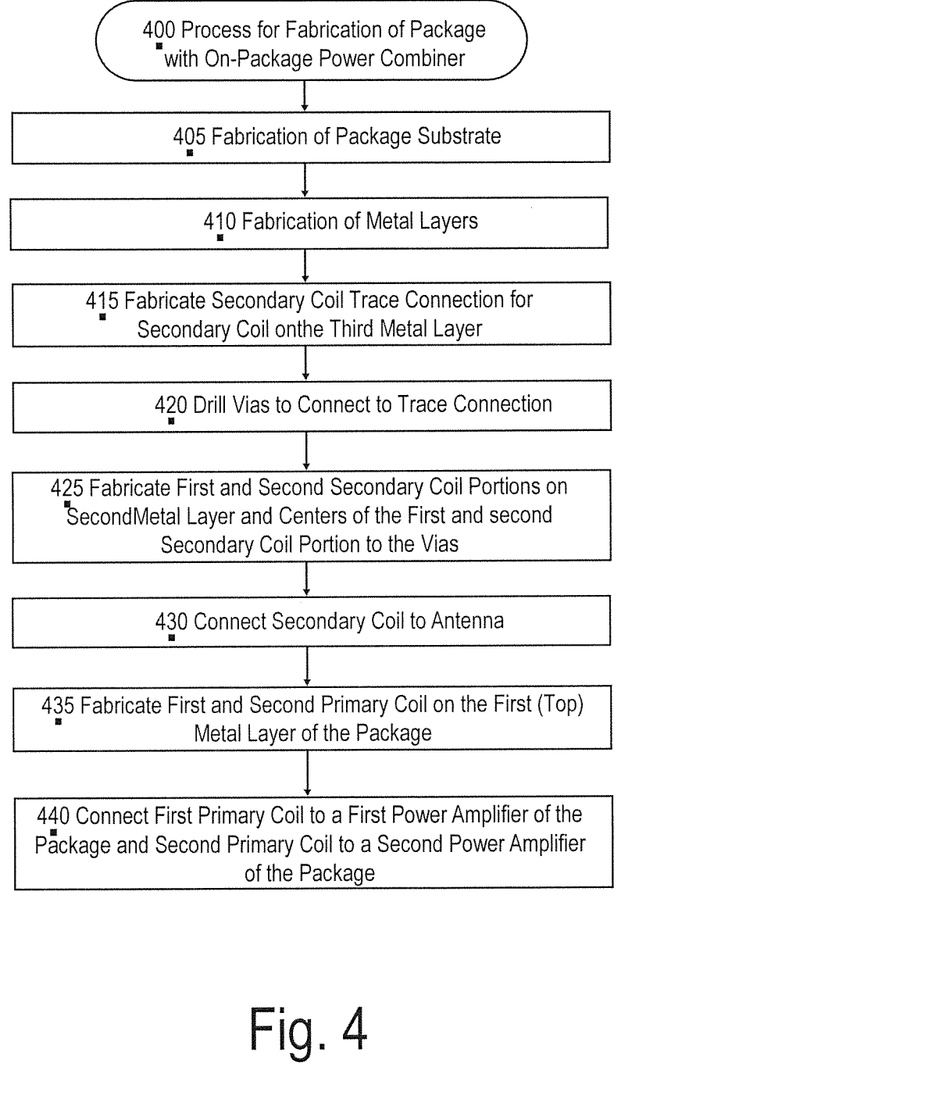
FIG. 4 is a flowchart to illustrate a process for fabrication of a package includes a power combiner.

FIG. 4 is a flowchart to illustrate a process for fabrication of a package includes a power combiner. In this illustration, it is assumed that a power combiner couples a first primary coil and a second primary coil with a secondary coil, and that the construction is on three metal layers of a package. However, embodiments are not limited to this implementation, and may include additional primary coils and additional metal layers in the construction of the on-package power combiner.

In some embodiments, a process 400 for fabrication of a package includes:

405: Fabrication of package substrate.

410: Fabrication of metal layers for the package, including a top (first) metal layer and two metal layers below (second and third metal layers).

415: Fabricate a secondary coil trace on third metal layer.

420: Drill or otherwise form vias connecting to the trace connection.

425: Fabricate first and second secondary coil portions on second metal layer, and connect centers of secondary coil portions to the vias to connect to the trace connection on the third metal layer.

430: In certain implementations the secondary coil may be connected with an antenna for signal transmission.

435: Fabricate the first primary coil and the second primary coil in the first (top) metal layer of the package.

440: Connect the first primary coil and the second primary coil to the elements to drive signals on such coils, such as connection of the first primary coil to a first power amplifier and connection of the second primary coil to a second power amplifier.

Figure 5:
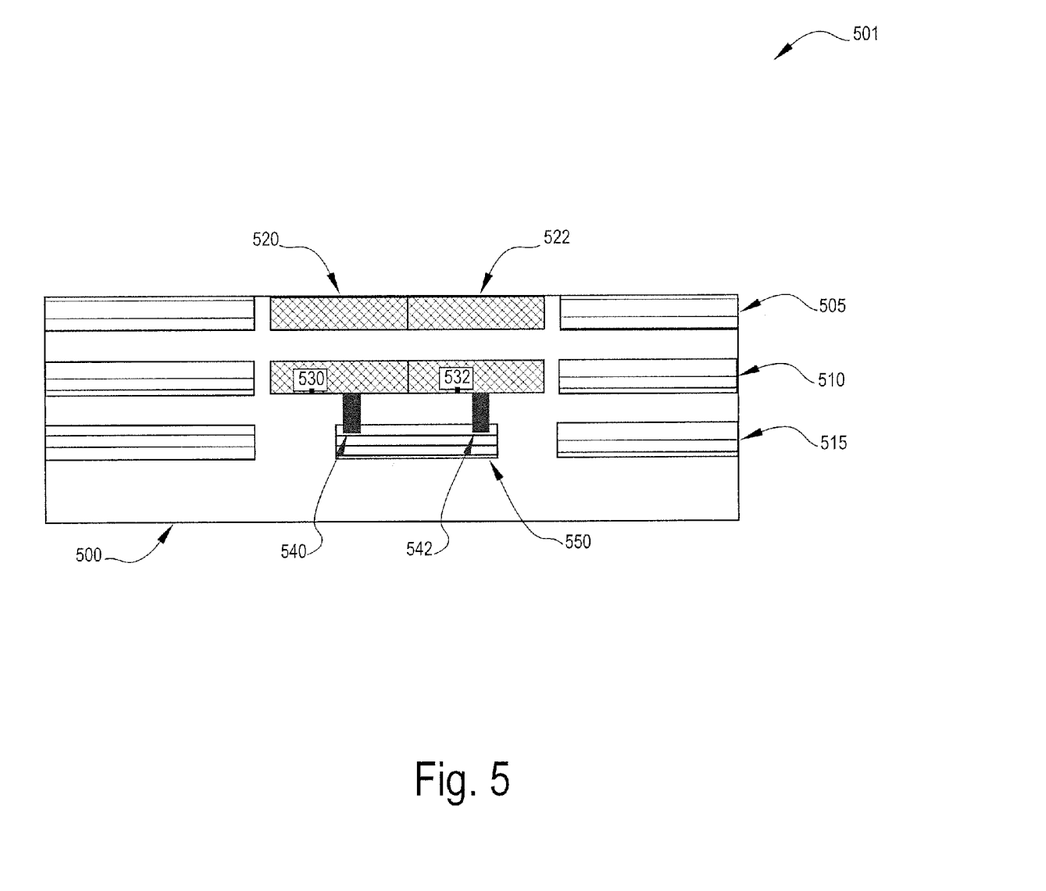
FIG. 5 is an illustration of a package including an on-package power combiner.

FIG. 5 is an illustration of a package including an on-package power combiner. In an embodiment, a package 500 includes a first (top) metal layer 505, a second metal layer 510 below the first metal layer 505, and a third metal layer 515 below the second metal layer 510.

In some embodiments, the package includes a first primary coil 520 and a second primary coil 522 fabricated on the first metal layer 505, such as illustrated in FIG. 3B. In some embodiments, the package further includes a first secondary coil portion 530 and a second secondary coil portion 532 fabricated on the second metal layer 510, and a trace connection 550 fabricated on the third metal layer 515.

In some embodiments, the first secondary coil portion 530 is connected to a first location on the trace 550 by a first via 540 and the second secondary coil portion 532 is connected to a second location on the trace 550 by a second via 542. In some embodiments, the trace connects the secondary coil portions in series to create a single secondary coil.

Figure 6:
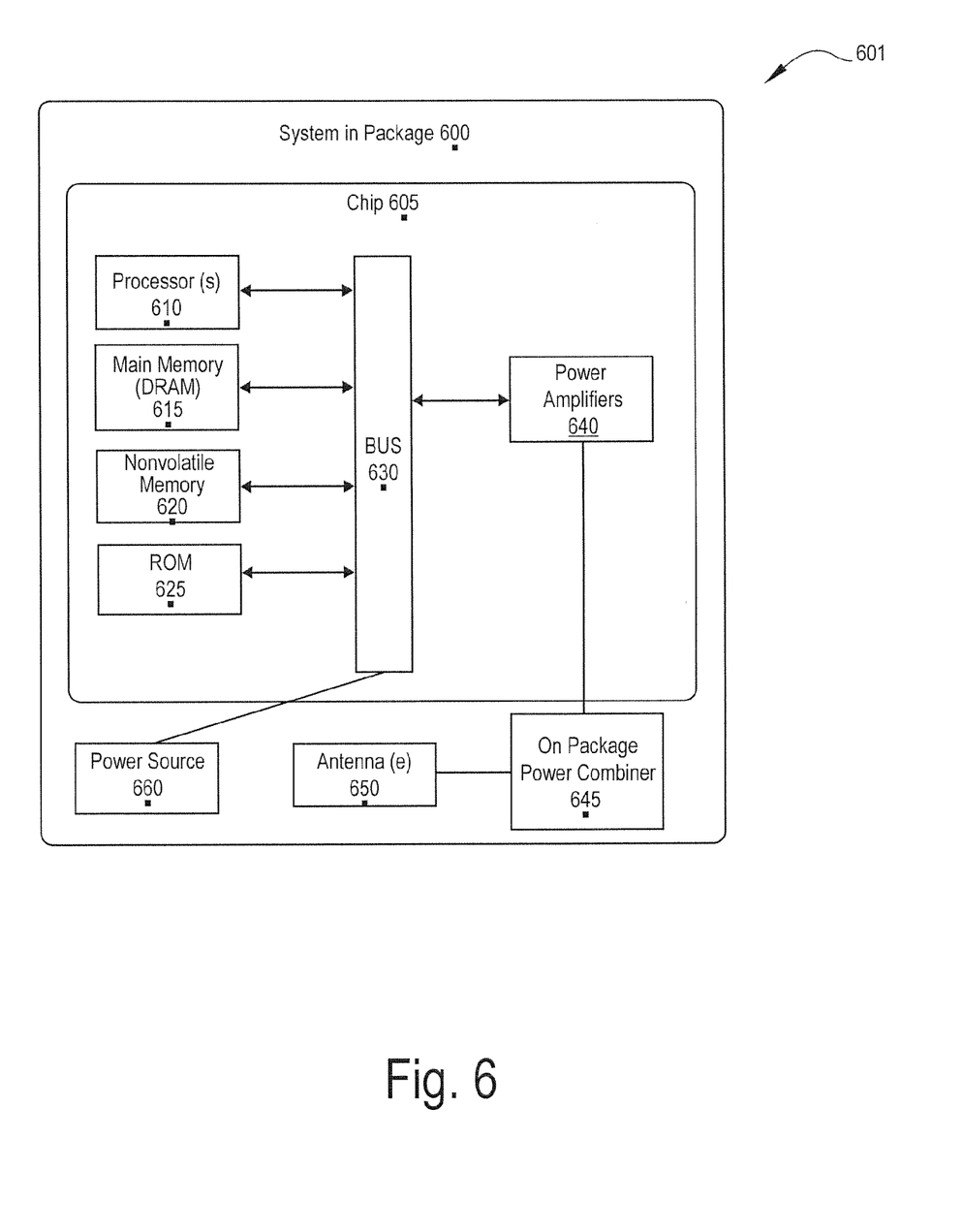
FIG. 6 is an illustration of a system according to an embodiment.

FIG. 6 is an illustration of a system according to an embodiment. In this illustration, certain standard and well-known components that are not germane to the present description are not shown.

In some embodiments, a system such as a system in package (SiP) 600 includes at least one silicon chip 605, for example a CMOS chip, on the package. In some embodiments, the chip 605 may include a processing means such as one or more processors 610 coupled to one or more buses or interconnects, shown in general as bus 630. The processors 630 may comprise one or more physical processors and one or more logical processors. In some embodiments, the processors may include one or more general-purpose processors or special-processor processors.

The bus 630 is a communication means for transmission of data. The bus 630 is illustrated as a single bus for simplicity, but may represent multiple different interconnects or buses and the component connections to such interconnects or buses may vary. The bus 630 shown in FIG. 6 is an abstraction that represents any one or more separate physical buses, point-to-point connections, or both connected by appropriate bridges, adapters, or controllers.

In some embodiments, the chip 605 further comprises a random access memory (RAM) or other dynamic storage device or element as a main memory 615 for storing information and instructions to be executed by the processors 610. Main memory 615 may include, but is not limited to, dynamic random access memory (DRAM).

The chip 605 also may comprise a non-volatile memory 620; and a read only memory (ROM) 625 or other static storage device for storing static information and instructions for the processors 610.

In some embodiments, the chip 605 includes multiple power amplifiers coupled to the bus 630. In some embodiments, in order to provide sufficient power gain, the system 600 includes an on package power combiner 645, such as illustrated in FIG. 3A and FIG. 5. In some embodiments, each amplifier of the power amplifiers 640 is coupled with a primary coil of a set of primary coils of the power combiner 645, the primary coils of the power combiner being coupled with a secondary coil. In some embodiments, the secondary coil may be coupled with an antenna for the transmission of signals The system 600 may also comprise a battery or other power source 660, which may include a solar cell, a fuel cell, a charged capacitor, near field inductive coupling, or other system or device for providing or generating power in the system 600. The power provided by the power source 660 may be distributed as required to elements of the system 600.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

A power combiner apparatus including a plurality of primary coils on a first metal layer of a package; a secondary coil on a second metal layer of the package, the secondary coil including a plurality of secondary coil portions, wherein each primary coil is located to be aligned with a respective one of the secondary coil portions; a trace on a third metal layer of the package; and a plurality of vias to connect the plurality of secondary coil portions to the trace on the third metal layer.

In some embodiments, each of the primary coils is connected with a respective power amplifier to drive a signal on the primary coil.

In some embodiments, the trace is to connect the plurality of secondary coil portions in series to form a single secondary coil.

In some embodiments, the secondary coil is connected with an antenna.

In some embodiments, the first metal layer is a top metal layer of the package. In some embodiments, the second metal layer is a next layer below the first metal layer, and the third metal layer is a next layer below the second metal layer.

In some embodiments, a method for fabricating an on package power combiner fabricating a trace on a third metal layer of a package, the package including a first metal layer, a second metal layer, and a third metal layer; forming a plurality of vias, including a first via to connect to a first location on the trace and a second via to connect to a second location on the trace; fabricating a plurality of secondary coil portions including a first secondary coil portion and a second secondary portion on the second metal layer, wherein fabricating the plurality of secondary coil portions includes connecting the first secondary coil portion with the first via and second secondary coil portion with the second via; fabricating plurality of primary coil portions on the first metal layer, including a first primary coil portion to be coupled with the first secondary coil portion and a second primary coil portion to be coupled with the second secondary coil portion.

In some embodiments, the method further includes connecting the first primary coil with a first power amplifier and the second primary coil with a second power amplifier.

In some embodiments, the trace is to connect the plurality of secondary coil portions in series to form a signal secondary coil.

In some embodiments, the method further includes connecting the secondary coil to an antenna for transmission of a signal.

In some embodiments, a system includes a chip including one or more of a processor for processing data, and a memory for storage of data; and a package including a power combiner apparatus, the power combiner apparatus including a plurality of primary coils on a first metal layer of the package, a secondary coil on a second metal layer of the package, the secondary coil including a plurality of secondary coil portions, wherein each primary coil is located to be aligned with a respective one of the secondary coil portions, a trace on a third metal layer of the package, and a plurality of vias to connect the plurality of secondary coil portions to the trace on the third metal layer.

In some embodiments, the chip further includes a plurality of power amplifiers. In some embodiments, each of the primary coils is connected with a respective power amplifier of the plurality of power amplifiers to drive a signal on the primary coil.

In some embodiments, the trace is to connect the plurality of secondary coil portions in series to form a single secondary coil.

In some embodiments, the system further includes an antenna. In some embodiments, the secondary coil is connected with the antenna.

In some embodiments, the first metal layer is a top metal layer of the package.

In some embodiments, the second metal layer is a next layer below the first metal layer, and the third metal layer is a next layer below the second metal layer.

In some embodiments, the chip is a CMOS (Complementary Metal-Oxide Semiconductor) device.

What is claimed is:

1. A power combiner apparatus comprising:
   a plurality of primary coils on a first metal layer of a package, wherein a first of the plurality of primary coils is in a first region of the first metal layer of the package, and a second of the plurality of primary coils is in a second region of the first metal layer of the package, and wherein the first region of the first metal layer of the package is non-overlapping with the second region of the first metal layer of the package;
   a secondary coil on a second metal layer of the package, the secondary coil including a plurality of secondary coil portions, wherein each primary coil is located to be aligned with a respective one of the secondary coil portions;
   a trace on a third metal layer of the package; and
   a plurality of vias to connect the plurality of secondary coil portions to the trace on the third metal layer.

2. The apparatus of claim 1, wherein each of the primary coils is connected with a respective power amplifier to drive a signal on the primary coil.

3. The apparatus of claim 1, wherein the trace is to connect the plurality of secondary coil portions in series to form a single secondary coil.

4. The apparatus of claim 3, wherein the secondary coil is connected with an antenna.

5. The apparatus of claim 1, wherein the first metal layer is a top metal layer of the package.

6. The apparatus of claim 5, wherein the second metal layer is a next layer below the first metal layer, and the third metal layer is a next layer below the second metal layer.

7. A method for fabricating an on package power combiner comprising:
fabricating a trace on a third metal layer of a package, the package including a first metal layer, a second metal layer, and a third metal layer;
forming a plurality of vias, including a first via to connect to a first location on the trace and a second via to connect to a second location on the trace;
fabricating a plurality of secondary coil portions including a first secondary coil portion and a second secondary portion on the second metal layer, wherein fabricating the plurality of secondary coil portions includes connecting the first secondary coil portion with the first via and second secondary coil portion with the second via;
fabricating a plurality of primary coils on the first metal layer, including a first primary coil to be coupled with the first secondary coil portion and a second primary coil to be coupled with the second secondary coil portion wherein the first primary coil is in a first region of the first metal layer of the package, and the second primary coil is in a second region of the first metal layer of the package, and wherein the first region of the first metal layer of the package is non-overlapping with the second region of the first metal layer of the package.

8. The method of claim 7, further comprising connecting the first primary coil with a first power amplifier and the second primary coil with a second power amplifier.

9. The method of claim 7, wherein the trace is to connect the plurality of secondary coil portions in series to form a signal secondary coil.

10. The method of claim 9, further comprising connecting the secondary coil to an antenna for transmission of a signal.

11. A system comprising:
a chip including one or more of:
a processor for processing data, and a memory for storage of data; and
a package including a power combiner apparatus, the power combiner apparatus including:
a plurality of primary coils on a first metal layer of the package, a secondary coil on a second metal layer of the package, the secondary coil including a plurality of secondary coil portions, wherein each primary coil is located to be aligned with a respective one of the secondary coil portions, a trace on a third metal layer of the package, and a plurality of vias to connect the plurality of secondary coil portions to the trace on the third metal layer, wherein a first of the plurality of primary coils is in a first region of the first metal layer of the package, and a second of the plurality of primary coils is in a second region of the first metal layer of the package, and wherein the first region of the first metal layer of the package is non-overlapping with the second region of the first metal layer of the package.

12. The system of claim 11, wherein the chip further includes a plurality of power amplifiers.

13. The system of claim 12, wherein each of the primary coils is connected with a respective power amplifier of the plurality of power amplifiers to drive a signal on the primary coil.

14. The system of claim 11, wherein the trace is to connect the plurality of secondary coil portions in series to form a single secondary coil.

15. The system of claim 11, further comprising an antenna.

16. The system of claim 15, wherein the secondary coil is connected with the antenna.

17. The system of claim 11, wherein the first metal layer is a top metal layer of the package.

18. The system of claim 17, wherein the second metal layer is a next layer below the first metal layer, and the third metal layer is a next layer below the second metal layer.

19. The system of claim 11, wherein the chip is a CMOS (Complementary Metal-Oxide Semiconductor) device.

* * * * *